(12) United States Patent
Tokuda et al.

(10) Patent No.: US 7,485,375 B2
(45) Date of Patent: Feb. 3, 2009

(54) LIGHT EMITTING DEVICE AND A METHOD OF MANUFACTURING THEREOF

(75) Inventors: Atsushi Tokuda, Kanagawa (JP); Takako Takasu, Kanagawa (JP); Satoshi Seo, Kanagawa (JP); Ryoji Nomura, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 238 days.

(21) Appl. No.: 10/735,732

(22) Filed: Dec. 16, 2003

(65) Prior Publication Data

US 2004/0241492 A1 Dec. 2, 2004

(30) Foreign Application Priority Data

Dec. 19, 2002 (JP) ............................ 2002-368692

(51) Int. Cl.
*H01L 51/50* (2006.01)
(52) U.S. Cl. ..................... 428/690; 428/917; 313/504; 313/506
(58) Field of Classification Search ................. 428/690, 428/917; 313/504, 506
See application file for complete search history.

(56) References Cited

U.S. PATENT DOCUMENTS

| | | | |
|---|---|---|---|
| 4,720,432 A | | 1/1988 | VanSlyke et al. |
| 5,458,977 A | * | 10/1995 | Hosokawa et al. ....... 428/411.1 |
| 5,723,873 A | * | 3/1998 | Yang ........................... 257/40 |
| 6,368,731 B1 | * | 4/2002 | Heuer et al. ................ 428/690 |
| 6,380,346 B1 | * | 4/2002 | Han ........................... 528/210 |
| 6,566,807 B1 | * | 5/2003 | Fujita et al. ................. 313/506 |
| 6,589,673 B1 | * | 7/2003 | Kido et al. .................. 428/690 |
| 6,613,454 B2 | * | 9/2003 | Ara et al. ..................... 428/690 |
| 2002/0041979 A1 | * | 4/2002 | Taguchi ....................... 428/690 |
| 2002/0096995 A1 | * | 7/2002 | Mishima et al. ............. 313/506 |
| 2002/0109136 A1 | | 8/2002 | Seo et al. |
| 2002/0130828 A1 | | 9/2002 | Yamazaki et al. |
| 2003/0008175 A1 | | 1/2003 | Lee et al. |
| 2003/0010959 A1 | | 1/2003 | Lee et al. |

FOREIGN PATENT DOCUMENTS

| | | | |
|---|---|---|---|
| JP | 2002-270474 | | 9/2002 |
| JP | 2003-017271 | | 1/2003 |
| JP | 2004-022292 | | 1/2004 |
| WO | WO 94/02530 | * | 2/1994 |

OTHER PUBLICATIONS

Lidberg et al., "Optical and Electrical Properties of Doped Poly-3-Octylthiophene Films", SPIE vol. 2397, p. 633-642 (1995).*
Yasuhiko Shirota et al., "Multilayered organic electroluminescent device using a novel starburst molecule, 4, 4', 4" -tris (3-methylphenyphenylamino) triphenylamine, and a hole transport material", Appl. Phys. Lett. 65 (7), Aug. 15, 1994, pp. 807-809.
S.A. VanSlyke et al., "Organic electroluminescent devices with improved stability", Appl. Phys. Lett. 69 (15) Oct. 7, 1996, pp. 2160-2162.
Y. Yang and A.J. Heeger,"Polyaniline as a transparent electrode for polymer light-emitting diodes: Lower operating voltage and higher efficiency" Appl. Phys. Lett. 64 (10) Mar. 7, 1994, pp. 1245-1247.
S.A. Carter et al., "Polymeric anodes for improved polymer light-emitting diode performance", Appl. Phys. Lett. 70 (16) Apr. 21, 1997, pp. 2067-2069.
Monthly Display, vol. 9 No. 9 pp. 18-21 (In Japanese), no date.
International Search Report (Application No. PCT/JP03/15766) dated Apr. 27, 2004 (In Japanese).
Ryuichi, "*Development of Polymer Materials and Its Application*", pp. 14, 16-17, Jan. 31, 2001.
Toray Research Center, Inc., "*Frontiers of Full-Fledged Practical Use of Organic El Displays From Organic El Materials to Devices and Displays*", pp. 134-135, Jun. 15, 1991.
Written Opinion (Application No. PCT/JP03/15766) Dated Jun. 1, 2004 (Partial Translation).

* cited by examiner

*Primary Examiner*—Dawn L Garrett
(74) *Attorney, Agent, or Firm*—Nixon Peabody LLP; Jeffrey L. Costellia

(57) ABSTRACT

An EL element is provided in which a conjugate polymer that has a polythiophene derivative, a polyaniline derivative, a polypyrrole derivative or a polyfuran derivative as a fundamental skeleton and is soluble in an organic solvent is oxidized in its main chain with a dopant of an electron-accepting organic molecule that does not contain an acid component, and the doped conjugate polymer is used as a material to form a hole injecting layer. The polymer, being soluble in an organic solvent, can be formed in film even on a substrate high in the water repellency; that is, it can be easily formed in film on a TFT substrate and the like indispensable for an active matrix display device. Furthermore, since a dopant that does not contain an acid component is used, influence on an organic thin film and an electrode that are in contact with the hole injecting layer can be suppressed to the minimum level.

14 Claims, 5 Drawing Sheets

LIGHT EMITTING DEVICE AND A METHOD OF MANUFACTURING THEREOF

FIELD OF THE INVENTION

The present invention belongs to a technical field relating to a display apparatus wherein a device (hereinafter referred to as electroluminescent device) having a structure that a thin film which emits light owing to a phenomenon called electroluminescence (hereinafter abbreviated to EL) is sandwiched between an anode and a cathode is provided on a substrate.

BACKGROUND ART

A display for displaying images is one of light emitting devices indispensable in the modern life and takes various forms such as a so-called TV monitor, a liquid crystal display developed rapidly in recent years, an organic EL display expected to be developed, and the like depending on the usage. Among the above, the organic EL display is best noted as a next generation flat panel display device.

A light emission mechanism of an electroluminescent device constituting the organic EL display is such that a luminescent layer made from a luminescent composition (hereinafter referred to as thin film) is provided between electrodes so that electrons injected from a cathode are recombined with holes injected from an anode at the recombination center of the luminescent layer to form molecular excitons when a current is supplied and photons discharged when the molecular excitons return to the ground state are used for the light emission.

As kinds of the molecular exciton that the luminescent composition forms, there are a singlet exciton and a triplet exciton. However both excitons are included in the specification.

In such an EL display element (hereinafter referred to as EL element), the thin film is usually formed with such a thin film thickness as less than 1 µm. Furthermore there is no need of a backlight that is used in a conventional liquid crystal display since the EL element is a self-emitting element in which a luminescent film itself emits light. Therefore, it is a great advantage to be capable of manufacturing the EL element which is very thin and lightweight.

Furthermore, in the case of a thin film having a thickness of substantially 100 to 200 nm, a time from injection of a carrier to recombination thereof is substantially tens nanoseconds in consideration of the carrier mobility of the luminant film. Consequently, even when a process from the recombination of the carrier to light emission is included, the light emission is caused within several microseconds. Accordingly, it is also advantageous in that a response speed is very fast.

Still furthermore, since the EL element is a light-emitting element of carrier-injection type, the direct current voltage drive is possible and it is hard to generate a noise. In addition, when a uniform and very thin film having a thickness of substantially 100 nm is made of an appropriate material, drive at a voltage of several volts can be realized. That is, the EL element is not only excellent in the visibility because it is self-emitting and large in a viewing angle but also has characteristics such as being thin and lightweight, high in the response speed, and drivable at direct current and low voltage. Accordingly, it is expected as a next generation light-emitting element.

As mentioned above, a light emission mechanism of an electroluminescent device constituting the organic EL display is such that a luminescent layer made from a luminescent composition is provided between electrodes so that electrons injected from a cathode are recombined with holes injected from an anode at the recombination center of the luminescent layer to form molecular excitons when a current is supplied and photons discharged when the molecular excitons return to the ground state are used for the light emission. Accordingly, one of preconditions for manufacturing a light emitting device of good efficiency is to inject the holes and the electrons efficiently into the thin film.

Under typical electroluminescent device operation conditions, a current of about 100 mA/cm2 is injected into the organic thin film inherently having a high electrical resistance. In order to realize such high density current injection, it is necessary to keep the sizes of a barrier against the holes injected from the anode and a barrier against the electrons injected from the cathode as small as possible. That is to say, it is necessary to use a metal having a small work function for the cathode and to select an electrode having a large work function for the anode. By selecting various metals and alloys for the cathode, it is practically possible to control the work function at will. In contrast, since transparency is required of the anode in general electroluminescent devices, the material to be used for the anode is limited to transparent conductive oxides under the current situation, and there is no alternative but to select some oxide conductive films such as an indium-tin oxide (hereinafter abbreviated to ITO) film in view of stability, transparency, resistivity, and the like at present.

The ITO electrode is indium doped tin which enter a substitution position of indium. Tins and slight amount of oxygen defects become donors to partially fill a conduction band, and thereby the conductivity appears. The ITO is deposited on glass by means of a sputtering method, an ion beam sputtering method and a vapor phase growth method. An electrode which is highly transparent and low in the resistance can be prepared by selecting a dope amount of tin appropriately.

However, since a surface of the ITO is not necessarily flat, therefore it is pointed out that a contact with a thin film that is used in an EL element deteriorates, or pinholes are caused in the thin film. This is said one of reasons that deteriorate an EL element. Furthermore, a work function of the ITO film can be changed to a certain degree by a process of film formation and a surface treatment, but such means have its limit. Therefore it is hard to reduce the hole injection barrier.

As one of methods to reduce the barrier against hole injection from the ITO cathode, an insertion of a buffer layer on the ITO film is known. By optimizing an ionization potential of the buffer layer, it is possible to reduce the hole injection barrier. The above-described buffer layer is called a hole injection layer. Materials which can function as the hole injection layer are generally classified into metal oxides, low molecular organic compounds, and high molecular compounds. Examples of the metal oxides are vanadium oxide, molybdenum oxide, ruthenium oxide, aluminum oxide, and the like. Examples of the low molecular organic compounds are starburst amines such as m-MTDATA, metal phthalocyanine, and the like. As the high molecular compounds materials, conjugate polymers such as polyaniline and a polythiophene derivative are known.

(Patent Literature 1)
U.S. Pat. No. 4,720,432
   (Non-patent Literature 1)
S. Tokito, et al., J. Pys. D1996, 29, pp. 2750-2753
   (Non-patent Literature 2)
T. Kurosaka, et al., Technical Report of IEICE, 1998, 98, pp. 63-68
   (Non-patent Literature 3)
Y. Shirota, et al., Appl. Phys. Lett., 1994, 65, pp. 807-809

(Non-patent Literature 4)
S. A. VanSlyke, et al., Appl. Phys. Lett., 1996, 69, pp. 2160-2162
(Non-patent Literature 5)
Y. Yang, et al., Appl. Phys. Lett., 1994, 64, pp. 1245-1247
(Non-patent Literature 6)
S. A. Carter, et al., Appl. Phys. Lett., 1997, 70, pp. 2067-2069

By using the above-described materials for the hole injection layer, the hole injection barrier is reduced and the holes are efficiently injected, thereby improving the efficiency and life of the EL device and reducing a driving voltage. Polymer base materials is characterized in that it can be coated on a surface of the ITO by means of such as a spin coat method or an ink jet method. In particular, the ink jet method has a benefit that it is capable of forming an arbitrary microscopic pattern by controlling a position where a liquid drop sticks to a substrate and is low cost and convenient, so plays an important role in a manufacturing technology of EL elements.

Thus, polymer base hole injecting materials capable of applying a low cost and convenient ink jet method are very hopeful materials; however, there are problems described below. The conjugate polymers such as abovementioned polyaniline and polythiophene hardly exhibit by itself the conductivity. When these are mixed with a strong acid such as camphor sulfonic acid or poly(styrene sulfonic acid), that is, when strong acid is doped to the conjugate polymer, high conductivity is developed. Thus doped conductive conjugate polymer works as a hole injecting material; however, since strong acid is used as a doping agent (hereinafter, referred to as "dopant"), a thin film and the ITO that come into contact with the hole injecting layer are likely to be largely damaged. Furthermore, in the case of an EL element being applied in a TV monitor and so on, an active matrix type light-emitting device on which thin film transistors (hereinafter, referred to as "TFT") are mounted is adopted; however, when a hole injecting material containing the strong acid is deposited on a substrate on which the TFTs are mounted, the TFT characteristics are largely adversely affected.

Furthermore, the polymer base material that has been conventionally used as the hole injecting material is insoluble in an organic solvent and is supplied as a water suspension after sulfonic acid that is strong acid is doped. Accordingly, in the case of deposition on a water-repellent substrate by ink jet method or spin coat method, the suspension liquid does not disperse uniformly, therefore it is difficult to form a uniform thin film because thickness of the hole injecting layer come to uneven. In particular, it is not necessarily easy to form a uniform and thin film on a substrate thereon TFTs are mounted since insulating materials that are used to insulate between the respective pixels, in many cases, are oleophilic, that is, water-repellent.

In other words, the polymer base hole injecting materials are advantageous in that these can be applied in the ink jet method or the spin coat method that is low in cost and convenient and can improve characteristics of an EL element. However, the polymer base hole injecting materials that have been conventionally adopted have large problems such as mentioned above fundamentally and leave a room of improvement.

DISCLOSURE OF THE INVENTION

Problems to be Solved the Invention

The present invention was carried out in view of the above problems and intends to provide a polymer base hole injecting material that can improve characteristics of an EL element and does not adversely affect on a thin film and an ITO film that come into contact therewith, and a method of manufacturing an EL element with the above materials.

Means for Solving the Problems

A gist of the present invention is in that firstly, a proper and reasonable side chain is introduced in a conjugate polymer molecule (conjugate polymer) that has a polythiophene derivative, a polyaniline derivative, a polypyrrole derivative or a polyfuran derivative as a fundamental skeleton, to make it soluble in an organic solvent, and thereby, without using strong acid or an oxidant, an electron-accepting organic compound is doped in the conjugate polymer as a dopant to oxidize a conjugate polymer main chain. The polymer that is thus oxidized in the main chain and thereby provided with the conductivity is deposited on an anode such as the ITO to form a hole injecting layer. Thereafter, the respective functional layers that constitute an EL element are laminated followed by finally forming a cathode, and thereby an EL element is prepared. Thereby, by diminishing damage to the respective functional layers and an anode that are in contact with a hole injecting layer the characteristics of an element can be improved, and by using a polymer soluble in an organic solvent as the hole injecting material a film is enabled to form on a water-repellent substrate.

As the conjugate polymer that has the polythiophene as a fundamental skeleton, at least one kind of compounds expressed by a formula (1) is recommended.

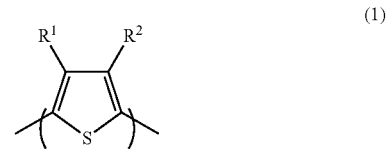

(1)

In the formula, substitution groups $R^1$ and $R^2$ may be the same or different from each other and represent an organic residue that may contain a hydrogen atom, an oxygen atom, a sulfur atom or a nitrogen atom. More specifically, aliphatic hydrocarbon groups having 4 to 30 carbon atoms (a n-butyl group, an isobutyl group, a sec-butyl group, a tert-butyl group, a n-pentyl group, a n-heptyl group, a 2,6-dimethylheptyl group, a 1-ethylpentyl group, a n-octyl group, a n-decyl group, a n-undecyl group and a n-heptadecyl group) and alicyclic hydrocarbon groups having 4 to 10 carbon atoms (a cyclobutyl group, a cyclopentyl group, a cyclohexyl group, a cycloheptyl group, a cyclooctyl group, a cyclononyl group and a cyclodecyl group) can be cited. Alternatively, these may be aromatic groups such as a phenyl group, a naphthyl group, an anthranil group and a pyrenyl group. In these aromatic groups, a hydrogen atom may be substituted with a hydrocarbon group and so on. Furthermore, these aromatic groups may form a bond through an alkylene group having 1 to 5 carbon atoms with a carbonyl group. Other than the above, these may be groups having a heterocycle. Furthermore, the substitution groups $R^1$ and $R^2$ may combine with a thiophene skeleton through an oxygen atom, a sulfur atom, a nitrogen atom, or a silicon atom.

As an electron-accepting organic compound that is doped as a dopant in the conjugate polymer, unsaturated compounds expressed by formulas (2) through (9) or aromatic compounds can be preferably used. When the conjugate polymer is doped, in many cases, the solubility to organic solvents high in the polarity is improved; accordingly, it is not so large in the necessity to introduce an alkyl side chain and so on into these electron-accepting organic compounds.

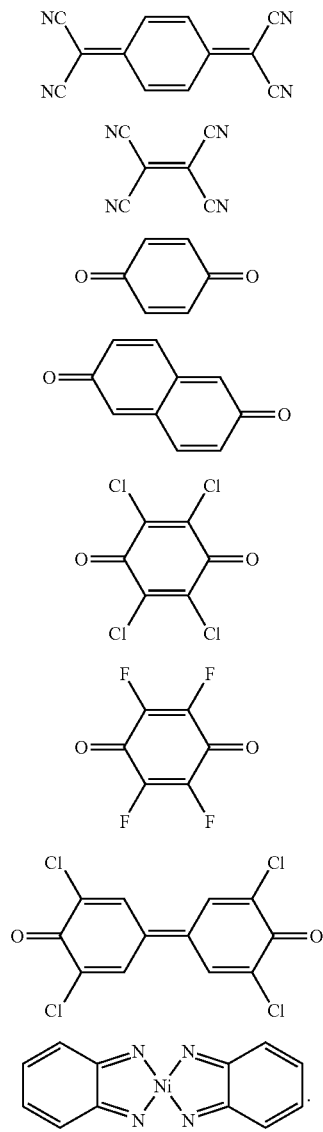

In the above invention, functional layers that constitute an EL element indicate ones obtained by depositing an electron injecting material, a hole transporting material, an electron transporting material, a hole blocking material, an electron blocking material, a luminescent material, other organic compounds or inorganic compounds that contribute to recombination of carriers and laminated bodies thereof. As the luminescent materials, organic compounds or inorganic compounds may be used. Furthermore, the luminescent materials may be ones in which fluorescence is emitted owing to a singlet excitation or may be ones in which phosphorescence is emitted owing to a triplet excitation.

In the present invention, in the case of the hole injecting layer being formed on an anode, a polymer main chain may be oxidized after a conjugate polymer is deposited; alternatively, on the contrary, the conjugate polymer may be deposited after the polymer main chain is oxidized. Furthermore, not only a conjugate polymer that is soluble in a non-oxidized state, that is, before the doping but also a conjugate polymer that is insoluble before the oxidation and becomes soluble after the oxidation may be used.

As means for depositing the conjugate polymer on an anode, a Langmuir-Blodgett method (LB method), a monomolecular laminating method, a dip coating method, a spin coat method, an ink jet method and a printing method can be used.

After the conjugate polymer is deposited as a hole injecting layer, the respective functional layers are laminated followed by finally forming a cathode. In the lamination of the respective functional layers, not only wet methods such as the Langmuir-Blodgett method (LB method), the monomolecular laminating method, the dip coating method, the spin coat method, the ink jet method and the printing method but also a vapor deposition method and a sputtering method can be applied. In the preparation of a cathode, a vapor deposition method and a sputtering method are applied. Thereby, an EL element and a light-emitting element including the same are prepared.

The invention can be carried out in the preparation of a passive matrix type light-emitting device or an active matrix type light-emitting device and is not particularly restricted to a form of a light-emitting device. Furthermore, a substrate is not restricted to glass, it may use a paper, a polymer film and a plate of inorganic oxides including glass.

EFFECT OF THE INVENTION

According to the invention, a hole injecting material that does not include an acid component and has a conjugate polymer soluble in an organic solvent as a fundamental skeleton can be designed and synthesized. Since the hole injecting material according to the invention does not contain an acid component, the characteristics of a thin film, an ITO film and a TFT that are in contact with the hole injecting material are not adversely affected. Furthermore, since the hole injecting material obtained according to the invention is soluble in an organic solvent, it can be uniformly coated even on a substrate that is high in the water repellency, that is, high in the oleophilicity. Accordingly, the characteristics and the reliability of an existing EL element can be largely improved.

BEST MODE FOR CARRYING OUT THE INVENTION

Embodiment 1

Figure 1:
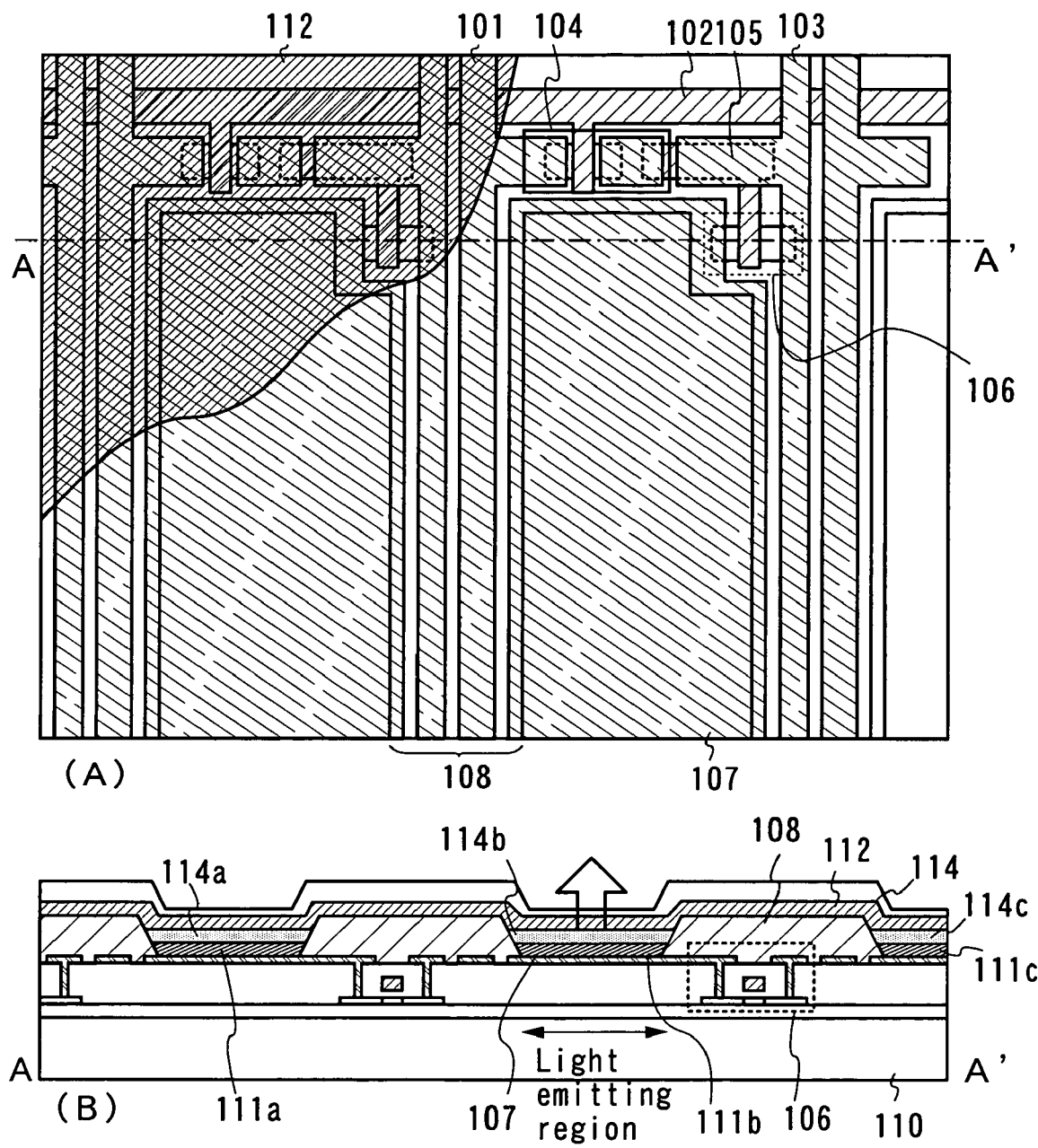
FIGS. 1 is a diagram of a light-emitting device that can be manufactured by applying the invention.

In the present embodiment, a structure of the conjugate polymer that is used as a hole injecting material will be shown. A compound shown by the formula (1) is a polythiophene derivative. Substitution groups $R^1$ and $R^2$ may be straight chain or branched alkyl groups having 4 or more carbon atoms, preferably straight chain or branched aliphatic hydrocarbon groups having 4 to 6 carbon atoms, or alicyclic hydrocarbon groups having 4 to 6 carbon atoms in order to impart the solubility to an organic solvent. Alternatively, a benzene ring or a condensed aromatic ring having an aliphatic hydrocarbon group or an alicyclic hydrocarbon group can be also introduced. Furthermore, an electron deficient hetero-aromatic ring such as a pyridine ring or a quinoxaline ring is introduced, and furthermore an aliphatic hydrocarbon group having 4 or more carbon atoms, or an alicyclic hydrocarbon group having 4 to 10 carbon atoms may be introduced into the hetero-aromatic ring. Polymers of these polythiophene derivatives are synthesized in film by electrochemically oxidatively polymerizing corresponding thiophene derivatives, or by chemically oxidatively polymerizing with an oxidant. The substituent groups are preferably introduced in both $R^1$ and $R^2$. The reason for this is in that since the site selectivity in the polymerization is low in the oxidative polymerization, polymerization sites are necessary to be controlled to 2 and 5 sites of the thiophene ring, and furthermore the conductivity of the conjugate polymer is improved by controlling the polymerization sites to 2, 5 sites. The substitution groups $R^1$ and $R^2$ are not necessarily the same one. This is because when the substitution groups $R^1$ and $R^2$ are not the same, the irregularity is caused in a main chain structure of the polymer, and thereby the solubility (in particular, the solubility to an organic solvent) can be improved. Furthermore, there is no need of employing only one thiophene derivative in the polymerization reaction, instead, with two or more thiophene derivatives at the same time, a conjugate polymer having a plurality of thiophene derivative units on a main chain, that is, a copolymer may be used. When a plurality of thiophene units (monomer) is irregularly arranged, the irregularity is generated in the main chain structure of the copolymer, and thereby an improvement in the solubility (in particular, the solubility to an organic solvent) can be expected.

On the other hand, in order to easily oxidize a main chain of a conjugate polymer with an electron-accepting organic compound, an electron-releasing substitution group has only to be introduced in the $R^1$ and $R^2$. Specifically, an aliphatic hydrocarbon group having a straight chain or branched structure, or an alicyclic hydrocarbon group through an oxygen atom, a sulfur atom, a nitrogen atom or a silicon atom has only to be introduced. Specifically, an alkoxy group, a thioalkyl group, a dialkylamino group, a trialkylsilyl group, and preferably alkoxy groups, thioalkyl groups, dialkylamino groups and trialkylsilyl groups having 4 to 6 carbon atoms can be cited. Furthermore, an aromatic substitution group having one of these substitution groups may be introduced, or the aromatic substitution description may be introduced through a heteroatom of one of these substitution groups. Still furthermore, like benzothiophene, it is also effective to condense 3, 4 sites of thiophene with the respective kinds of aromatic rings to expand a π-conjugate system. The conjugate polymer of the polythiophene derivative in which one of these electron releasing substitution groups is introduced is synthesized in film by electrochemically oxidation polymerizing corresponding thiophene derivatives or by chemically oxidation polymerizing the same with an oxidant. The substituent groups are preferably introduced in both $R^1$ and $R^2$. The reason for this is in that since the site selectivity in the polymerization is low in the oxidative polymerization, polymerization sites are necessary to be controlled to 2 and 5 sites of the thiophene ring, and furthermore by controlling the polymerization sites to 2, 5 sites the conductivity of the polymer is improved. The substitution groups $R^1$ and $R^2$ are not necessarily the same one. This is because when the substitution groups $R^1$ and $R^2$ are not the same, the irregularity is caused in a main chain structure of the polymer, and thereby the solubility (in particular, the solubility to an organic solvent) can be improved. Furthermore, there is no need of employing only one thiophene derivative in the polymerization reaction, so a polymer having a plurality of thiophene derivative units on a main chain, that is, a copolymer may be used with two or more thiophene derivatives at the same time. That is because an improvement in the solubility (in particular, the solubility to an organic solvent) can be expected when an irregularity is generated in the main chain structure of the copolymer by arranging a plurality of thiophene units irregularly.

In the above, the substitution groups $R^1$ and $R^2$ of the thiophene derivative are explained; however, it goes without saying that when the substitution groups $R^1$ and $R^2$ are applied as a substitution group of other polyaniline, polypyrrole and polyfuran derivatives, the hole injecting material according to the invention can be obtained.

An example of a method of synthesizing thiophene monomer for synthesizing a compound expressed by the formula (1) and a polymerization method thereof is shown as follows.

An example of synthesizing 3,4-dihexoxythiophene as a thiophene monomer is shown below. 2 mL of sulfuric acid was added in an ethanol solution (800 mL) of thiodiglycolic acid (250 g, 1.67 mol) to prepare a reaction solution, then the reaction solution was refluxing under heating for 12 hr after stirring for 24 hr. Subsequently, substantially 500 mL of water and ethanol was removed from the reaction solution according to azeotropy. Furthermore, 400 mL of ethanol was added and after refluxing under heating for 20 hr, the reaction solution was added water to extract with ether. A layer of ether was dried with magnesium sulfate, followed by filtering and concentrating. The residue was distilled under reduced pressure of 200 Pa and a temperature of 100 to 110 degree centigrade, and thereby thiodiglycolic acid diethylester was obtained at a yield of 90 percent.

The obtained thiodiglycolic acid diethylester (115 g, 558 mmol) was dissolved in a dehydrated ethanol solution (500 mL) of diethyl oxalate (83.5 g, 0.571 mmol), followed by dropping into an ethanol solution of sodium ethoxide (168 g, 2.5 mol). After the dropping came to completion, it was stirred at 50 degree centigrade for 2 hr. A generated precipitate was filtrated and a filtrate was washed with ethanol. The filtrate was dissolved in 1500 mL of distilled water, followed by dropping hydrochloric acid of 1 M until pH became substantially 1. A generated precipitate was filtrated, a filtrate was washed with water and dried, followed by recrystallizing with ethyl acetate, and thereby 2,5-diethoxycarbonyl-3,4-dihydroxy thiophene was obtained at a yield of 25 percent.

Under a nitrogen atmosphere, potassium carbonate (40 g) was added to a dry DMF (300 mL) solution of 2,5-diethoxycarbonyl-3,4-dihydroxy thiophene (30 g). Thereafter, 1-bromohexane (35 mL) was added, followed by stirring at 100 degree centigrade for 24 hr. After a reaction mixture was cooled to room temperature, 800 mL of acetone was poured thereto, followed by stirring for substantially 10 min. A generated solid was filtrated, a filtrate was washed with water, followed by drying. An obtained solid was recrystallized with ethyl acetate. A recrystallized solid was heated at 210 degree centigrade for 4 hr, followed by dissolving in acetone, further followed by filtering to obtain an acetone soluble part. After acetone was distilled and removed, the residue was purified according to silica gel chromatography. An obtained liquid was further distilled under reduced pressure (400 Pa, 170 to 173 degree centigrade), and thereby a targeted 3,4-dihexoxythiophene was obtained at a yield of 38 percent. A structure was checked according to NMR. $^1$H NMR (CDCl$_3$) δ 6.16 (s, 2H), 3.97 (t, 4H, J=6.6 Hz), 1.70-1.85 (m, 4H), 1.20-1.50 (m, 12H), 0.90 (t, 6H, J=6.9 Hz).

Furthermore, in the case of 3,4-dihydroxythiophene being synthesized as a thiophene monomer, the synthesis was carried out similarly to that of 3,4-dihydroxythiophene with ethyl bromide as a halide. A structure was checked according to NMR. $^1$H NMR (CDCl$_3$) δ 6.15 (s, 2H), 3.97 (t, 4H, J=6.6 Hz), 0.90 (t, 6H, J=6.9 Hz).

An example of polymerizing 3,4-dihydroxythiophene that is a monomer will be shown. In a dry chloroform suspension (150 mL) of 4.16 g of iron chloride (III), a dry chloroform solution (50 mL) of 3,4-dihydroxythiophene (0.85 g) was dropped at 0 degree centigrade, followed by stirring as it is at 0 degree centigrade for 20 hr. After a solvent was distilled and removed under reduced pressure, 300 mL of methanol was added, followed by stirring for 1 hr. A generated solid was filtered, followed by washing with methanol and water. The solid was suspended in ammonium water (200 mL), a precipitate obtained after the stirring of several hr was filtered, followed by washing with methanol, water and further acetone. An obtained solid was dissolved in chloroform, a soluble part was concentrated and dried, and thereby poly (3,4-dihexoxythiophene) expressed by the formula (1) was obtained at a yield of 52 percent. An obtained polymer was soluble in organic solvents such as THF, ether, chloroform, and toluene. The polymerization of 3,4-diethoxythiophene that is a monomer was carried out similarly.

Embodiment 2

In the next place, an electron-accepting organic compound that oxidizes a conjugate polymer that is used as the hole injecting material described in embodiment 1, that is, an electron-accepting organic compound as a dopant that is doped in the conjugate polymer will be described. Furthermore, a doping method thereof will be described.

In formulas (2) through (9), examples of electron-accepting organic compounds that oxidize the conjugate polymer are shown. In order to speedily oxidize a main chain of the conjugate polymer, an unsaturated compound or an aromatic compound having the electron-accepting property can be preferably used. In many cases, when a conjugate polymer is doped, the solubility to an organic solvent high in the polarity is improved. Therefore, it has no need to introduce an alkyl side chain and the like to the electron-accepting organic compound. Furthermore, as the electron-accepting organic compound, a polymer in which an organic compound having one of the structures according to the formulas (2) through (9) is introduced in a side chain also can be used.

As a doping method, the conjugate polymer has only to be mixed with the electron-accepting compound in a polar solvent. As the polar solvent, DMF, NMP, DMAc or MSO can be cited. A solution is coated on a substrate after the mixing. In this case, a spin coating method, an ink jet method, a dip coating method, an LB method or a spray method can be used.

Alternatively, after an un-doped conjugate polymer dissolved beforehand in an organic solvent is coated on a substrate, the substrate may be dipped in a solution in which the electron-accepting compound is dissolved. As another method, after an un-doped conjugate polymer dissolved beforehand in an organic solvent is coated on a substrate, the substrate may be brought into contact with vapor of the electron-accepting compound under reduced pressure.

Instead of using an electron-accepting compound as a dopant that is doped in a conjugate polymer, a conjugate polymer may be electrochemically oxidized. For instance, after a supporting electrolyte such as tetrabutyl ammonium salt or metal perchlorate is dissolved in a polar solvent, the conjugate polymer is dissolved, thereafter a working electrode and an opposite electrode are inserted in a solution, followed by oxidizing at an appropriate and reasonable potential. The appropriate and reasonable potential is a potential at which a main chain of the conjugate polymer is oxidized and can be easily determined by cyclic voltametry (hereinafter referred to as "CV"). Alternatively, the conjugate polymer dissolved beforehand in an organic solvent is coated on a conductive substrate such as ITO or metal, thereafter the substrate is dipped in a polar solvent in which a supporting electrolyte such as tetrabutyl ammonium salt or metal perchlorate is dissolved, an opposite electrode is inserted in a solution, followed by oxidizing at a potential where a main chain of the conjugate polymer is oxidized.

Embodiment 3

In the present embodiment, a method of laminating the respective functional layers on a substrate on which the hole injecting material that is prepared by applying the materials and methods shown in embodiments 1 and 2 is formed will be described.

As the substrate thereon the ITO is coated, not only quartz and glass but also paper and plastic resins can be used. Furthermore, a substrate on which TFTs are mounted beforehand can be used. At least one layer of hole injecting layer is laminated on the substrate with a hole injecting material that is prepared by adopting the conjugate polymer and the electron-accepting organic compound described in embodiments 1 and 2 and according to the method shown in embodiment 1.

Thereafter, the respective functional layers are laminated. As the functional layers, a hole transporting layer, a luminescent layer, an electron transporting layer, an electron injecting layer, a hole blocking layer and an electron blocking layer can be cited. The hole transporting layer is disposed so as to come into contact with the hole injecting layer, the luminescent layer is disposed so as to come into contact with the hole transporting layer, the electron transporting layer is disposed so as to come into contact with the luminescent layer, the electron injecting layer is disposed so as to come into contact with the electron transporting layer. Furthermore, a blocking material larger in difference between energies of a highest occupied molecular orbit and a lowest unoccupied molecular orbit than that of a hole transporting material contained in the hole transporting layer may be contained between the hole transporting layer and the cathode.

As the laminating methods of these functional layers, not only wet methods such as a spin coat method, a dip coating method, an LB method, a monomolecular film laminating method and a spray method but also dry methods such as a vacuum deposition method and a sputtering method can be adopted. Thereafter, a cathode is prepared according to a method such as a vacuum deposition method and a sputtering method, a prepared element is sealed with glass and the like, and thereby the element comes to completion.

In an experiment, on a glass substrate on which an ITO film was prepared, a chloroform solution (15 mL) of 50 mg of poly (3,4-dihexoxythiophene) and tetracyanoquinodimethane (8 mg) was spin coated followed by drying under reduced pressure, and thereby a hole injecting layer was formed. The spin coat conditions were 5 sec at 500 rpm and 20 sec at 1500 rpm. NPB and Alq were deposited on the film of poly (3,4-dihexoxythiophene) according to the vacuum deposition method, and further thereon an alloy of Al and Li was deposited as an electrode. When the element is energized, green luminescence was obtained. A luminescence start voltage was 7V and brightness of 1000 Cd/M² was obtained at 17V. A current efficiency was substantially 4 Cd/A when the element is driven so as to emit with the brightness of 1000 Cd/m².

Embodiment 4

In the present embodiment, an example of a light-emitting device that can be prepared by carrying out the invention will be explained with reference to FIG. 1. In a pixel configuration shown in FIG. 1(A), reference numerals 101, 102, 103, 104, 105, 106 and 107, respectively, denote a data signal line, a gate signal line, a power supply line, a switching TFT (hereinafter referred to as "switching TFT"), a capacitor for holding electric charges, a driving TFT for supplying a current to a light-emitting element (hereinafter referred to as "driving TFT") and a pixel electrode that is connected to a drain of the driving TFT and works as an anode of the light-emitting element. Furthermore, a reference numeral 112 denotes an opposite electrode that works as a cathode of the light-emitting element.

At this time, a drawing corresponding to a cross section in A-A' is shown in FIG. 1(B). In FIG. 1'(B), a reference numeral 110 denotes a substrate for which a glass substrate, a quartz substrate, a plastics substrate and other transparent substrates can be used. Over the substrate 110, a driving TFT 106 is formed by use of a semiconductor process. Furthermore, so that an end portion of the pixel electrode 107 that is formed so as to connect with the driving TFT 106 and at least the driving TFT and the switching TFT may be covered, an insulator 108 patterned in lattice is disposed.

On the pixel electrode 107, hole injecting layers 111a through 111c are formed by use of the materials and the methods shown in embodiments 1 and 2, followed by laminating functional layers 114a through 114c including a luminescent layer as shown in embodiment 3. When polymer is coated on the substrate followed by electrochemically doping, the pixel electrode 107 itself works as a working electrode. Thereafter, the opposite electrode 112 that works as a cathode and a passivation film 113 are disposed. The functional layers 114a through 114c are a hole transporting layer, a luminescent layer, an electron transporting layer, an electron injecting layer, a hole blocking layer or an electron blocking layer, a layer including other organic compound or inorganic compound that contributes to the recombination of carriers, or a laminated body thereof.

Furthermore, an aluminum film or a silver thin film containing an element belonging to a first or second group of the periodic table can be used as the opposite electrode 112. However, in this embodiment, since light emitted from the functional layers 114a through 114c including the luminescent layer has to be transmitted, a film thickness of the opposite electrode is desirably set at 50 nm or less. Furthermore, insulating films that exhibit high blocking properties to moisture and oxygen such as a silicon nitride film, an aluminum nitride film, a diamond-like carbon film and so on can be used as the passivation film 113.

In the present invention, a conjugate polymer that is soluble in an organic solvent and doped without using strong acid or an oxidant is used as a hole injecting layer. As mentioned above, a TFT substrate is not necessarily high in the hydrophilicity. Furthermore, the conjugate polymer that has been conventionally used as the hole injecting material is supplied as an aqueous suspension. Accordingly, in order to form a thin film of a hole injecting layer having conjugate polymer as a composition on a less hydrophilic surface of ITO of a TFT substrate, the substrate has to be washed in many steps. In view of the above, EL elements with high throughput can be manufactured according to low cost and convenient method, because the hole injecting layer can be easily formed on the less hydrophilic TFT substrate by carrying out the present invention. Furthermore, in the present invention, since a doping material does not contain a strong acid component, an element is suppressed from deteriorating and the reliability of the light-emitting device can be improved.

Embodiment 5

Figure 2:
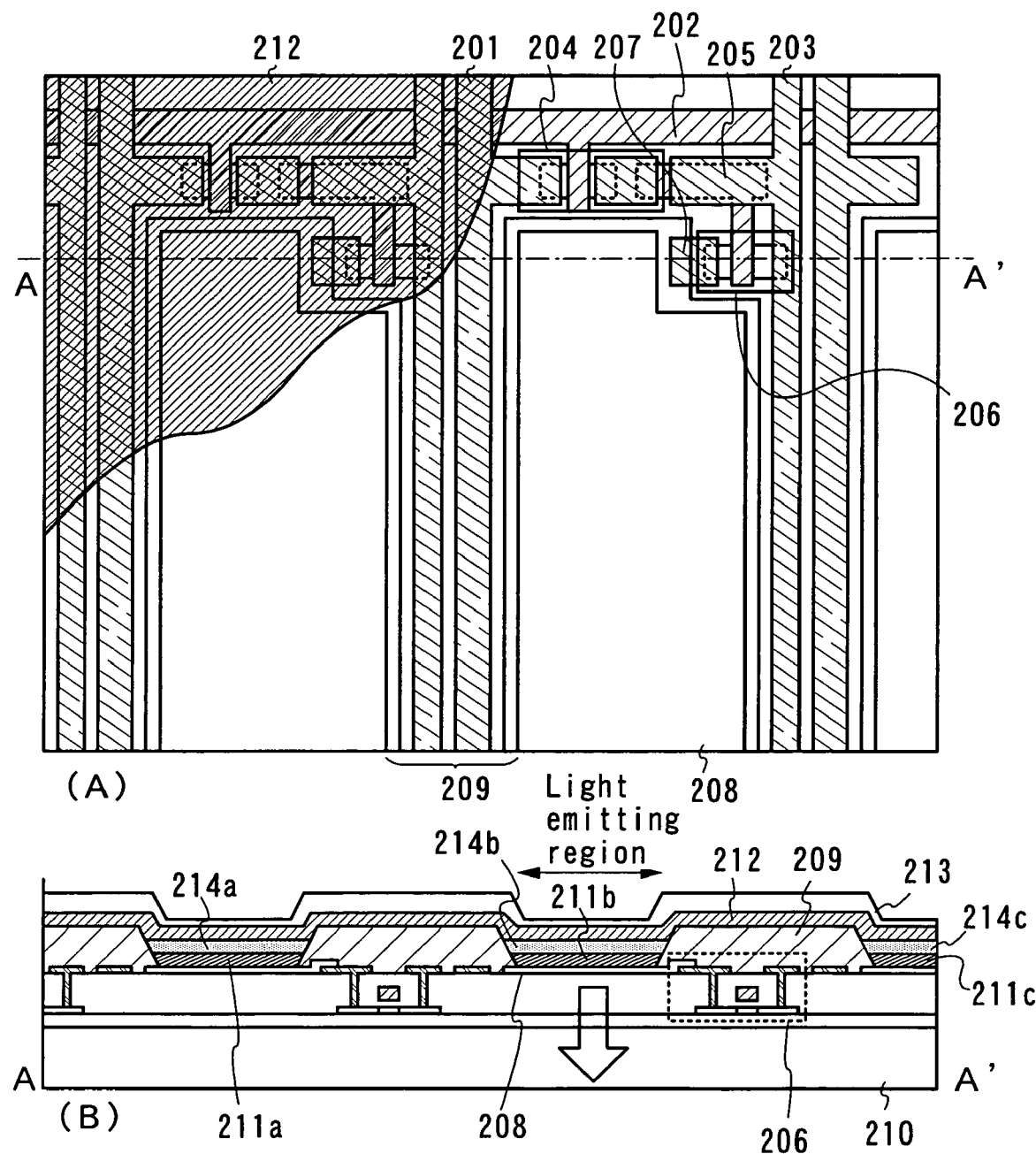
FIGS. 2 is a diagram of a light-emitting device that can be manufactured by applying the invention.

In the present embodiment, an example of a light-emitting device that can be manufactured by carrying out the present invention will be explained with reference to FIG. 2. In a pixel configuration shown in FIG. 2(A), reference numerals 201, 202, 203, 204, 205, 206, 207 and 208, respectively, denote a data signal line, a gate signal line, a power supply line, a switching TFT, a capacitor for holding electric charges, a driving TFT, a drain electrode of the driving TFT, and a pixel electrode that is connected to a drain electrode of the driving TFT and works as an anode of the light-emitting element. A conductive film which is transparent to visible light is preferably used as the pixel electrode 208, so that light emitted from a luminescent layer may be transmitted, that is, oxide conductive films such as ITO (compound of indium oxide and tin oxide) and a compound of indium oxide and zinc oxide can be preferably used. Furthermore, a reference numeral 212 denotes an opposite electrode that works as a cathode of the light-emitting element.

A drawing corresponding to a cross section in A-A' is shown in FIG. 2(B). In FIG. 2(B), a reference numeral 210 denotes a substrate, and a glass substrate, a quartz substrate, a plastics substrate and other transparent substrates being used for the substrate. Over the substrate 210, a driving TFT 206 is formed by use of a semiconductor process. Furthermore, so that an end portion of the pixel electrode 208 that is formed so as to connect with the driving TFT 206 and at least the driving TFT and the switching TFT may be covered, an insulator 209 patterned in lattice is disposed.

On the pixel electrode 208, hole injecting layers 211a through 211c are formed by use of the hole injecting material prepared by use of the materials and the methods shown in embodiments 1 and 2. When a polymer that is a conjugate polymer is coated on the substrate followed by electrochemically doping, the pixel electrode itself works as a working electrode. Thereafter, as shown in embodiment 3, functional layers 214a through 214c including a luminescent layer are laminated. The functional layers 214a through 214c indicate a carrier injecting layer, a carrier transporting layer, a carrier blocking layer, a luminescent layer, a layer including other organic compound or inorganic compound that contributes to the recombination of carriers, or a laminated body thereof. Known materials may be used for the lamination structure and materials of the functional layers 214a through 214c.

Furthermore, an aluminum film, a silver thin film or the like containing an element belonging to a first or second group of the periodic table can be used as the opposite electrode 212. Furthermore, insulating films that exhibit high blocking properties to moisture and oxygen such as a silicon nitride film, an aluminum nitride film, a diamond-like carbon film and so on can be used as the passivation film 213.

In the present invention, a conjugate polymer that is soluble in an organic solvent and can be doped without using strong acid or an oxidant, that is, an oxidized conjugate polymer is used as a hole injecting layer. As mentioned above, the TFT substrate is not necessarily high in the hydrophilicity. Furthermore, the conjugate polymer that has been conventionally used as the hole injecting material is supplied as an aqueous suspension. Accordingly, in order to form a thin film of a hole injecting layer having a conjugate polymer as a composition on a less hydrophilic surface of ITO of a TFT substrate, the substrate has to be washed in many steps. In view of the above, EL elements with high throughput can be manufactured according to low cost and convenient method, because the hole injecting layer can be easily formed on the less hydrophilic TFT substrate by carrying out the present invention. Furthermore, in the present invention, since a doping material does not contain a strong acid component, an element is suppressed from deteriorating and the reliability of the light-emitting device can be improved.

Embodiment 6

Figure 3:
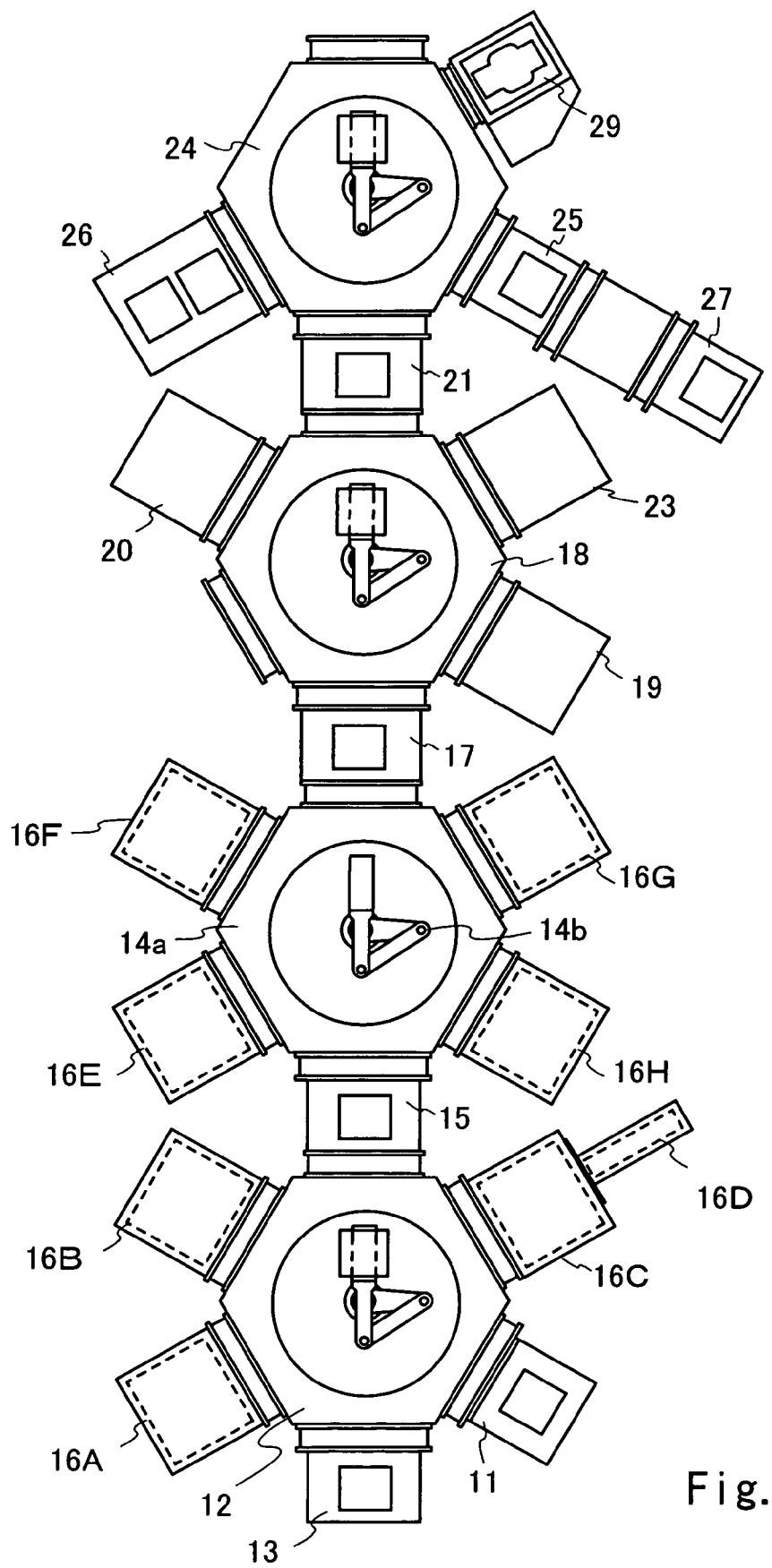
FIG. 3 is a diagram showing a manufacturing method of a light-emitting device that can be manufactured by applying the invention.

In the present embodiment, an example of multi-chamber type manufacturing apparatus in which steps from the formation of a luminescent material to the sealing of a light-emitting element are automated is shown in FIG. 3. In FIG. 3, a reference numeral 11 denotes a charging chamber of a received substrate, reference numerals 12, 14a, 18 and 24 denote transporting chambers (also called as common chambers) for transporting a substrate that is to be treated to the respective chambers, reference numerals 15, 17 and 21 denote delivering chambers for delivering a substrate between the respective transporting chambers, and reference numeral 29 denotes a takeout chamber of a treated substrate. Furthermore, reference numeral 13 denotes a pre-treatment chamber where an electrode surface on the substrate is cleaned beforehand or the work function is adjusted.

Reference numeral 16A denotes a spin coater chamber where doped, that is, oxidized conjugate polymer is coated on an electrode on the substrate by means of spin coat method, and reference numeral 16B denotes a spin coater chamber where undoped conjugate polymer is coated on an electrode on the substrate by means of spin coat method. In the case of the undoped conjugate polymer being electrochemically oxidized, a substrate which is coated the undoped conjugate polymer is transferred to an electrolysis pretreatment chamber 16C, the substrate is disposed in a vertical direction, that is, a surface that is to be treated is disposed in parallel with a direction of gravity, followed by transferring to an electrolysis chamber 16D. The substrate is dipped in the electrolysis chamber 16D in an electrolysis bath that accommodates a solution of supporting electrolyte, and, in this state, electrodes on the substrate are energized under constant potential or constant current condition to apply electrochemical doping. Thus, a hole injecting layer is prepared on the substrate. Thereafter, the substrate is transferred to the electrolysis pretreatment chamber 16C again followed by washing, further followed by disposing so that a surface that is to be treated may be in parallel with a horizontal plane.

The substrate on which the hole injecting layer is formed is transferred to the transporting chamber 14a through the delivery chamber 15. In deposition chambers 16E through 16H connected to the transporting chamber 14a, the respective functional layers and electrodes are laminated. The functional layers and electrodes are prepared by means of a spin coat method, a vapor deposition method or a sputtering method, and the respective deposition chambers can be fitted to specifications corresponding to the depositing methods. In the preparation of a cathode, in the case of the vapor deposition method, there is concern in that the TFT and luminescent material may be deteriorated owing to radiation such as X-ray and electron beam; accordingly, the deposition chamber due to a sputtering method is desirable. After arbitrary functional layers are laminated, the substrate that is to be treated is to the transporting chamber 24 transferred through the delivery chamber 21. Reference numerals 27, 25, and 26, respectively, denote a seal substrate load chamber for stocking a sealing substrate, a dispenser chamber for forming a sealing material, and a sealing chamber for sealing a light-emitting element by laminating the substrate that is to be treated and a sealing substrate.

In the manufacturing apparatus shown in FIG. 3, each of the respective chambers is separated from each other with a gate valve and can be hermetically sealed from other chambers. Furthermore, each of the chambers is connected to a vacuum exhaust pump and can maintain a vacuum or make a reduced pressure atmosphere by introducing an inert gas. It goes without saying that deposition can be carried out under atmospheric inert gas. As the vacuum pump, a magnetically levitated turbo-molecular pump, a cryo-pump or a dry pump can be used. Furthermore, an inert gas that is introduced is desirably sufficiently purified by previously passing through a purification apparatus and the like.

A configuration of the manufacturing apparatus shown in FIG. 3 is only one example and the present invention is not restricted thereto. The embodiment shows that preparation apparatus of a hole injecting layer for carrying out a method of preparing a light-emitting device that is the present invention can be combined with the multi-chamber type manufacturing apparatus.

Embodiment 7

Figure 4:
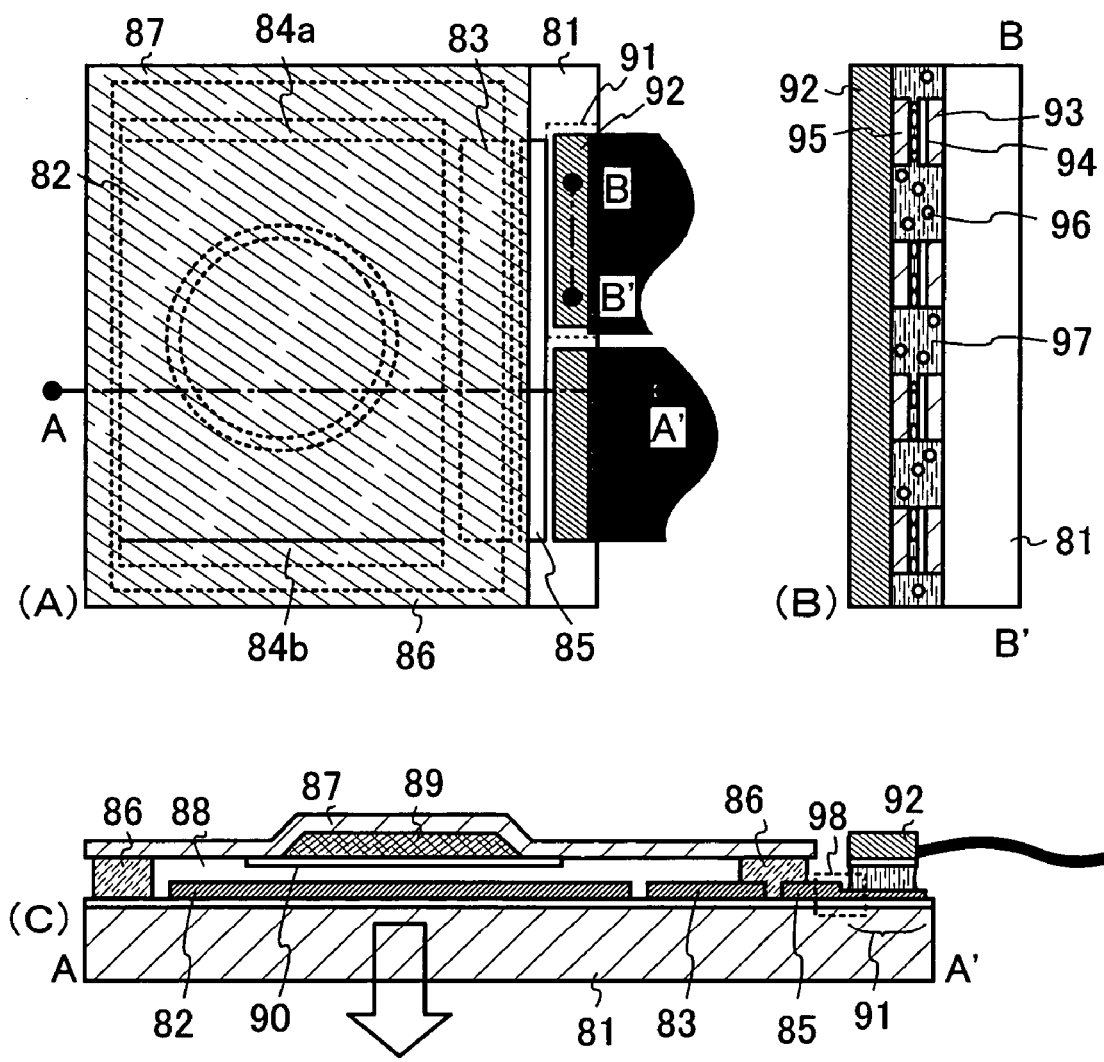
FIGS. 4 is a diagram showing appearance of a light-emitting device that can be manufactured by applying the invention.

In the present embodiment, an entire configuration of a light-emitting device that is prepared by carrying out the present invention will be explained with reference to FIG. 4. FIG. 4 is a top view of a light-emitting device that is formed by sealing an element substrate on which thin film transistors are formed with a sealant, FIG. 4(B) being a sectional view in B-B' in FIG. 4(A), FIG. 4(C) being a sectional view in A-A' in FIG. 3(A).

Over a substrate 81, a pixel portion (display portion) 82, a data line driving circuit 83 that is disposed so as to surround the pixel portion 82, gate line driving circuits 84a and 84b and a protection circuit 85 are disposed, and a seal material 86 is disposed so as to surround these. The pixel portion 82 is provided with a light-emitting element prepared by carrying out the present invention. A UV curable resin, an epoxy resin and other resins can be used as the seal material 86; however, it is preferable to use materials as low as possible in the hygroscopicity. The seal material 86 may be disposed partially overlapped with the data line driving circuit 83, the gate line driving circuits 84a and 84b and the protection circuit 85, or may be disposed avoiding these circuits.

The sealing material 87 is adhered with a seal material 86, and thereby a hermetically sealed space 88 is formed with the substrate 81, the seal material 86 and the sealing material 87. Glass, metals (typically stainless steel), ceramics and plastics (including plastic films) can be used as the sealing material 87. Furthermore, the sealing with an insulating film alone is possible.

When a material different from the substrate 81 is used as the sealing material 87, the adhesiveness of the seal material 86 may be damaged owing to the difference in the thermal expansion coefficient. Accordingly, it is desirable to use a material same as the substrate 81 on which transistors are formed as the sealing material 87. In other words, a substrate having the thermal expansion coefficient same as that of the substrate 81 is desirably used. In this embodiment, glass is used as a material of the substrate 81 and the sealing material 87, and furthermore the thermal expansion coefficient of the sealing material 87 is controlled by letting undergo the thermal history same as that the substrate 81 undergoes in the manufacturing process of a thin film transistor.

The sealing material 87 is provided beforehand with an absorbent (barium oxide or calcium oxide) 89 in a recess, and the absorbent plays a role of maintaining a clean atmosphere by absorbing moisture and oxygen inside of the hermetically sealed space 28 and thereby an EL layer is inhibited from deteriorating. The recess is covered with a dense mesh-like covering material 90, and the covering material 90 allows air and moisture to permeate but does not allow the absorbent 89 to permeate. The hermetically sealed space 88 has only to be filled with nitrogen or a rare gas such as argon and may be filled with a resin or liquid when it is inactive.

Over the substrate 81, in order to transmit signals to the data line driving circuit 83 and the gate line driving circuits 84a and 84b, a terminal portion 91 is disposed, and data signals such as video signals are transmitted to the terminal portion 91 through a FPC (flexible print circuit) 92. In a section of the terminal portion 91, as shown in FIG. 4(B), a wiring having a structure in which an oxide conductive film 94 is laminated on a wiring 93 that is formed simultaneously with a gate wiring and a data wiring, and a wiring 95 disposed on a side of the FPC 92 are electrically connected by use of a resin 97 in which a conductor 96 is dispersed. Ones obtained by plating a spherical polymer compound with gold or silver may be used as the conductor 96.

In this embodiment, the protection circuit 85 is disposed between the terminal portion 91 and the data line driving circuit 83 and plays a role of letting a pulse signal go outside when static electricity such as a sudden pulse signal comes in between the both. At that time, firstly, a high voltage signal that comes in instantaneously is dulled with a capacitor, and other high voltages can be let go outside through a circuit configured with a thin film transistor and a thin film diode. It goes without saying that the protection circuit may be disposed in other places such as a place between the pixel portion 82 and the data line driving circuit 83 and a place between the pixel portion 82 and the gate line driving circuits 84a and 84b.

Embodiment 8

Figure 5:
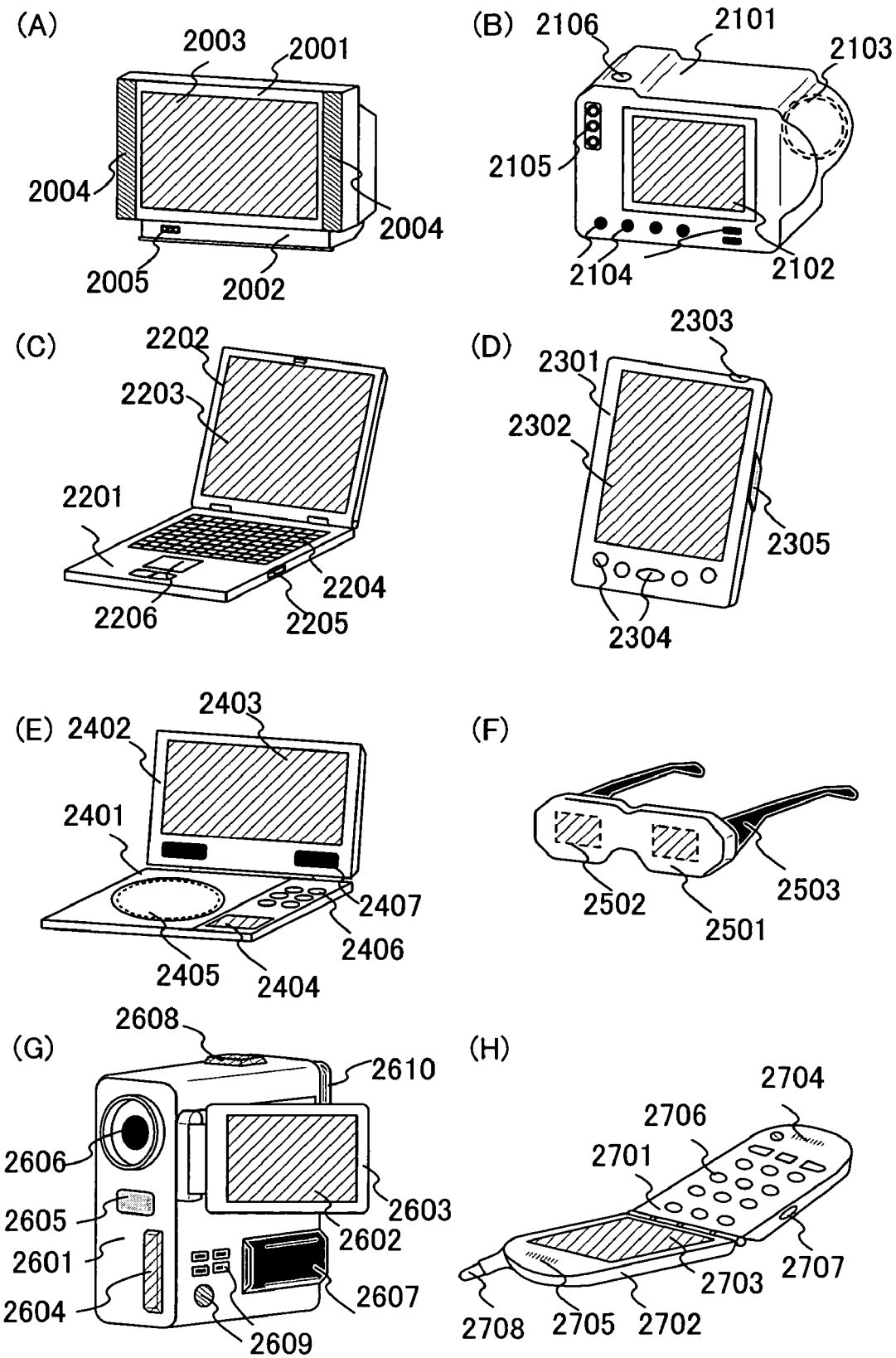
FIGS. 5 is a diagram showing examples of electronic devices provided with a light-emitting device that can be manufactured by applying the invention.

It is possible to manufacture an electronic device by incorporating thereinto the light emitting device obtained by carrying out this invention. Examples of the electronic device are a video camera, a digital camera, a goggle-shaped display (a head mount display), a navigation system, a sound reproduction system (car audio, audio compo, and the like), a notebook type personal computer, a game console, a personal digital assistant (mobile computer, mobile phone, mobile game console, an electronic dictionary, and so forth), an image reproduction system provided with a recording medium (specifically, an apparatus provided with a display capable of reproducing a recording medium such as a digital versatile disc (DVD) and displaying images recorded on the medium), and the like. Specific examples of the electronic devices are shown in FIG. 5.

Shown in FIG. 5(A) is a television which has a housing 2001, a base 2002, a display 2003, a speaker 2004, a video input terminal 2005, and so forth. This invention is applicable to the display 2003. The television inclusively means all kinds of televisions used for information display, such as those for PC, TV broadcasting reception, advertisement display, and the like.

Shown in FIG. 5(B) is a digital camera which has a body 2101, a display 2102, an image receiver 2103, an operation key 2104, an external connection port 2105, a shutter 2106, and so forth. The present invention is applicable to the display 2102.

Shown in FIG. 5(C) is a notebook type personal computer which has a body 2201, a housing 2202, a display 2203, a keyboard 2204, an external connection port 2205, a pointing mouse 2206, and so forth. The present invention is applicable to the display 2203.

Shown in FIG. (D) is a mobile computer which has a body 2301, a display 2302, a switch 2303, an operation key 2304, an infrared ray port 2305, and so forth. The present invention is applicable to the display 2302.

Shown in FIG. 5(E) is a mobile image reproduction system (specifically, a DVD reproduction system) provided with a recording medium, which includes a body 2401, a housing 2402, a display A 2403, a display B 2404, a recording medium (ex. DVD) reader 2405, an operation key 2406, a speaker 2407, and so forth. The display A 2403 mainly displays image information, and the display B 2404 mainly displays textual information. The present invention is applicable to both of the display A 2403 and the display B 2404. A home game console and the like are included among the image reproduction systems provided with the recording medium.

Shown in FIG. 5(F) is a goggle-shaped display (a head mount display) which has a body 2501, a display 2502, and an arm 2503. The present invention is applicable to the display 2502.

Shown in FIG. 5(G) is a video camera which has a body 2601, a display 2602, a housing 2603, an external connection port 2604, a remote control receiver 2605, an image receiver 2606, a battery 2607, an audio input 2608, an operation key 2609, an eyepiece 2601, and so forth. The present invention is applicable to the display 2602.

Shown in FIG. 5(H) is a mobile phone which has a body 2701, a housing 2702, a display 2703, an audio input 2704, an audio output 2705, an operation key 2706, an external connection port 2707, an antenna 2708, and so forth. The present invention is applicable to the display 2703. In addition, it is possible to suppress power consumption of the mobile phone by displaying texts on the display 2703 in such a fashion that white colored texts are displayed on a black background.

As described above, the light emitting apparatus obtained by carrying out this invention is usable as the display of various electronic devices.

The invention claimed is:

1. A light-emitting device comprising:
a cathode;
an anode that constitutes a pair together with the cathode;
a hole injecting layer in contact with the anode and disposed between the anode and the cathode; and
a luminescent layer that is disposed between the hole injecting layer and the cathode and emits light when an electric field is applied,
wherein the hole injecting layer comprises an electron-accepting organic compound and a conjugate polymer and
wherein the conjugate polymer has a repeating unit expressed by the formula (1)

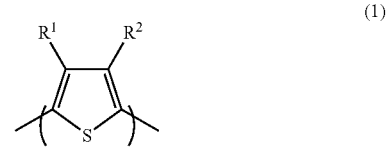

(1)

wherein $R^1$ and $R^2$ are the same or different and selected from a dialkylamino group, a trialkylsilyl group, and an aromatic substitution group having a substitution group selected from a thioalkyl group, a dialkylamino group, and a trialkylsilyl group.

2. The light-emitting device according to claim 1, wherein the light-emitting element includes a hole transporting layer disposed so as to come into contact with the hole injecting layer.

3. The light-emitting device according to claim 1, wherein the light-emitting element includes a hole transporting layer disposed so as to come into contact with the hole injecting layer and the luminescent layer disposed so as to come into contact with the hole transporting layer.

4. The light-emitting device according to claim 1, wherein the light-emitting element includes a hole transporting layer disposed so as to come into contact with the hole injecting layer, the luminescent layer disposed so as to come into contact with the hole transporting layer, and an electron transporting layer disposed so as to come into contact with the luminescent layer.

5. The light-emitting device according to claim 1, wherein the light-emitting element includes a hole transporting layer disposed so as to come into contact with the hole injecting layer, the luminescent layer disposed so as to come into contact with the hole transporting layer, an electron transporting layer disposed so as to come into contact with the luminescent layer, and an electron injecting layer disposed so as to come into contact with the electron transporting layer.

6. The light-emitting device according to claim 1, wherein the electron-accepting organic compound is at least one kind of compounds expressed by the formulas (2) through (9)

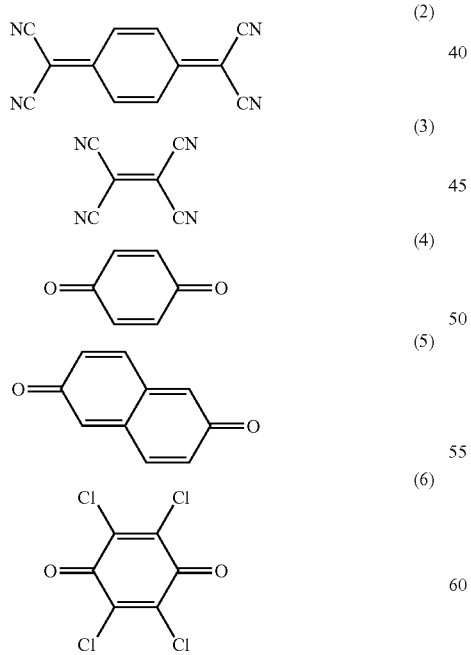

-continued

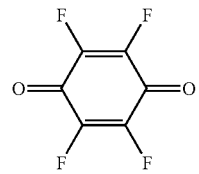

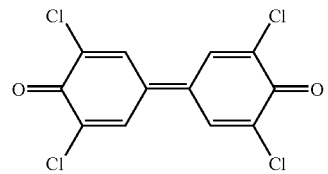

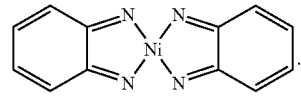

7. The light-emitting device according to claim 2, wherein a blocking material having an energy difference between a highest occupied molecular orbit and a lowest unoccupied molecular orbit larger than that of a hole transporting material contained in the hole transporting layer is contained in a region between the hole transporting layer and the cathode.

8. The light-emitting device according to claim 3, wherein a blocking material having an energy difference between a highest occupied molecular orbit and a lowest unoccupied molecular orbit larger than that of a hole transporting material contained in the hole transporting layer is contained in a region between the hole transporting layer and the cathode.

9. The light-emitting device according to claim 4, wherein a blocking material having an energy difference between a highest occupied molecular orbit and a lowest vacant molecular orbit larger than that of a hole transporting material contained in the hole transporting layer is contained in a region between the hole transporting layer and the cathode.

10. The light-emitting device according to claim 5, wherein a blocking material having an energy difference between a highest occupied molecular orbit and a lowest vacant molecular orbit larger than that of a hole transporting material contained in the hole transporting layer is contained in a region between the hole transporting layer and the cathode.

11. The light-emitting device according to claim 1, wherein the light-emitting element includes a compound that exhibits emission from a triplet-excitation state.

12. The light-emitting device according to claim 1, wherein the conjugate polymer is electrochemically oxidized.

13. The light-emitting device according to claim 1, wherein the conjugate polymer is formed in film owing to electric field polymerization of corresponding monomers.

14. An electric appliance comprising a light-emitting device according to claim 1.

* * * * *